United States Patent
Lee et al.

(10) Patent No.: US 7,799,641 B2
(45) Date of Patent: Sep. 21, 2010

(54) METHOD FOR FORMING A SEMICONDUCTOR DEVICE HAVING RECESS CHANNEL

(75) Inventors: Jin Yul Lee, Seoul (KR); Min Ho Ha, Icheon-shi (KR); Seon Yong Cha, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 118 days.

(21) Appl. No.: 11/548,285

(22) Filed: Oct. 11, 2006

(65) Prior Publication Data
US 2007/0155101 A1 Jul. 5, 2007

(30) Foreign Application Priority Data
Dec. 29, 2005 (KR) ............. 10-2005-0134292

(51) Int. Cl.
H01L 21/336 (2006.01)
(52) U.S. Cl. ......... 438/270; 257/E21.41; 257/E21.428; 257/E21.429
(58) Field of Classification Search ........... 438/257, 438/259, 270, 271, 589; 257/330, E21.429, 257/332, E21.443, E29.267, E21.618, E21.428
See application file for complete search history.

(56) References Cited

U.S. PATENT DOCUMENTS

| | | | | |
|---|---|---|---|---|
| 5,629,226 A * | 5/1997 | Ohtsuki | ................ | 438/389 |
| 7,052,972 B2 * | 5/2006 | Sandhu et al. | ............. | 438/445 |
| 2001/0023960 A1 | 9/2001 | Soga et al. | | |
| 2002/0094647 A1 * | 7/2002 | Woerlee et al. | ............. | 438/289 |
| 2002/0115270 A1 * | 8/2002 | Wu | ............. | 438/484 |
| 2003/0157777 A1 * | 8/2003 | Van Zeghbroeck et al. | .. | 438/343 |
| 2004/0129670 A1 * | 7/2004 | Kweon et al. | ............. | 216/22 |
| 2004/0222457 A1 * | 11/2004 | Kim et al. | ............. | 257/328 |
| 2004/0266103 A1 * | 12/2004 | Lee et al. | ............. | 438/255 |
| 2005/0020086 A1 * | 1/2005 | Kim et al. | ............. | 438/700 |
| 2005/0077568 A1 * | 4/2005 | Park et al. | ............. | 257/330 |
| 2005/0272233 A1 * | 12/2005 | Lee et al. | ............. | 438/585 |
| 2006/0049455 A1 * | 3/2006 | Jang et al. | ............. | 257/330 |
| 2006/0060936 A1 | 3/2006 | Park et al. | | |
| 2006/0113590 A1 * | 6/2006 | Kim et al. | ............. | 257/330 |

(Continued)

FOREIGN PATENT DOCUMENTS

KR 10-2005-0045560 A 5/2005

*Primary Examiner*—W. David Coleman
*Assistant Examiner*—Latanya Crawford
(74) *Attorney, Agent, or Firm*—Townsend and Townsend and Crew LLP

(57) ABSTRACT

A method for forming a semiconductor device having recess channel includes forming a hard mask film pattern for exposing first regions for forming the trenches on a semiconductor substrate; forming first trenches by a first etching process using the hard mask film pattern as a mask, and removing the hard mask film pattern; forming a barrier film on the semiconductor substrate including the first trenches; forming an ion implantation mask film for exposing the first trenches on the barrier film; forming an ion implantation region in the semiconductor substrate below the first trenches using the ion implantation mask film and the barrier film; forming bulb-shaped second trenches by a second etching process using the ion implantation mask film and the barrier film as a mask, so that bulb-type trenches for recess channels, each including the first trench and the second trench, are formed; and removing the ion implantation mask film and the barrier film.

13 Claims, 8 Drawing Sheets

U.S. PATENT DOCUMENTS

2007/0004126 A1* 1/2007 Jang .......................... 438/243
2007/0004145 A1* 1/2007 Kim et al. .................. 438/259
2007/0155101 A1* 7/2007 Lee et al. ................... 438/259
2007/0290258 A1* 12/2007 Son et al. ................... 257/330

* cited by examiner

METHOD FOR FORMING A SEMICONDUCTOR DEVICE HAVING RECESS CHANNEL

BACKGROUND OF THE INVENTION

The present invention relates to a method for fabricating a semiconductor device and more particularly to a method for forming a semiconductor device having recess channels.

As the degree of integration in an integrated circuit semiconductor device increases and design rules rapidly decrease, the difficulty in assuring the stable operation of transistors increases. For example, transistor gate widths and channel lengths are reduced rapidly. These causes short channel effects and can generate a punch through between the source and drain of the transistor. Punch through is one of the common reasons for the device malfunction. In order to overcome the short channel effect, various methods for assuring a sufficient channel length without increasing design rules have been developed. Particularly, a method for fabricating a semiconductor device having bulb-type recess channels using a two-stage etching process to increase the length of the channels in comparison with the line width of the gates has been proposed.

FIGS. 1 and 2 are sectional views illustrating a conventional method for fabricating a semiconductor device having recess channels.

Referring to FIG. 1, bulb-type trenches 104 for recess channels are first formed in a semiconductor substrate 100 in which active regions are defined by an isolation structure 102. In order to provide the cell transistors with suitable threshold voltages, channel ion implantation is performed on the entire semiconductor substrate 100 surface. Thereby forming the impurity regions 106 surrounding the bulb-type trenches 104 for recess channels.

Referring to FIG. 2, gate stacks 118 are then formed on the bulb-type trenches 104 for recess channels, and source/drain regions 120 are formed by injecting impurities into the semiconductor substrate 100. The gate stack 118 is made up of a gate insulating film pattern 110, a conductive film pattern 112, a metal film pattern 114, and a hard mask film pattern 116.

Region A shows where the impurity region 106 overlaps the source/drain region 120. The overlapping regions cause a localized increase in the concentration of impurities, which leads to an increase in the electric fields. Thereby, the threshold voltage is changed and the refresh characteristic of a semiconductor device is degraded.

SUMMARY OF THE INVENTION

One embodiment of the present invention relates to a method for forming a semiconductor device having recess channels, which decreases the intensity of electric fields in the regions where the source/drain and impurity regions overlap, thus improving the refresh characteristics of the semiconductor device.

Another embodiment provides a method for forming a semiconductor device having recess channels, which prevents damage to the upper portions of the trenches during the etching process.

According to one implementation, a method for a semiconductor device having recess channels comprises forming a hard mask film pattern for exposing first regions for forming the trenches on a semiconductor substrate; forming first trenches by a first etching process using the hard mask film pattern as a mask and removing the hard mask film pattern; forming a barrier film on the semiconductor substrate including the first trenches; forming an ion implantation mask film for exposing the first trenches on the barrier film; forming an ion implantation region in the semiconductor substrate below the first trenches using the ion implantation mask film and the barrier film. The method further includes forming bulb-shaped second trenches by a second etching process using the ion implantation mask film and the barrier film as a mask, so that bulb-type trenches for the recess channels are formed and removing the ion implantation mask film and the barrier film.

The method may further comprise forming a buffer film pattern before the forming of the hard mask film pattern. The hard mask film pattern is made of a polysilicon film, the buffer film pattern may be made of an oxide film, the ion implantation mask film may comprise a photoresist film, and the barrier film may comprise a high thermal oxide a film.

The ion implantation region is formed by a Local Channel Implantation process for implanting impurities into portions of the semiconductor substrate under the bulb-type trenches for recess channels.

Further, preferably, the ion implantation region is formed by a Local Channel Implantation process for implanting impurities into the semiconductor substrate at a tilt angle of 5~7° and in the rotating direction of angles of 0° and 180°.

Preferably, the ion implantation region is formed at positions having a depth of 400~1,000 Å from the bottoms of the first trenches. In the present embodiment, an upper region of the ion implantation region is provided to be 400~1,000 Å below the lowest end of the first trench while a lower region of the ion implantation region extends further below.

The bulb-shaped second trenches may be formed to have a depth of 400~1,000 Å from the bottoms of the first trenches.

The second etching process may employ an isotropic etching method.

In accordance with another aspect of the present invention, a method for forming trenches for recess channels in a semiconductor device comprises forming a hard mask film pattern for exposing first regions, for forming the trenches on a semiconductor substrate; forming first trenches by a first etching process using the hard mask film pattern as a mask; forming an ion implantation region in the semiconductor substrate below the first trenches using the hard mask film pattern, and removing the hard mask film pattern; forming a barrier film on the whole surface of the semiconductor substrate; forming bulb-shaped second trenches by a second etching process using the barrier film as a mask, so that bulb-type trenches for recess channels are formed; and removing the barrier film.

The method may further comprise forming a buffer film pattern before the forming of the hard mask film pattern. The hard mask film pattern may be made of an amorphous carbon film, and have a thickness of 2,000~3,000 Å.

The buffer film pattern may be made of an oxide film.

Preferably, the first trenches has a depth of 400~1,000 Å.

The ion implantation region is formed by a Local Channel Implantation process for implanting impurities perpendicularly into portions of the semiconductor substrate under the bulb-type trenches for recess channels.

Further, preferably, the ion implantation region is formed at positions having a depth of 400~1,000 Å from the bottoms of the first trenches.

The a Local Channel Implantation process may be performed by implanting impurities into the semiconductor substrate at an energy of 20~30 keV and at a dose of 2.0~5.0E13 ions/cm$^2$.

The barrier film may have a thickness of 30~100 Å.

The bulb-shaped second trenches may be formed to have a depth of 400~1,000 Å from the bottoms of the first trenches.

The second etching process may employ an isotropic etching method.

DESCRIPTION OF THE SPECIFIC EMBODIMENTS

Figure 1:
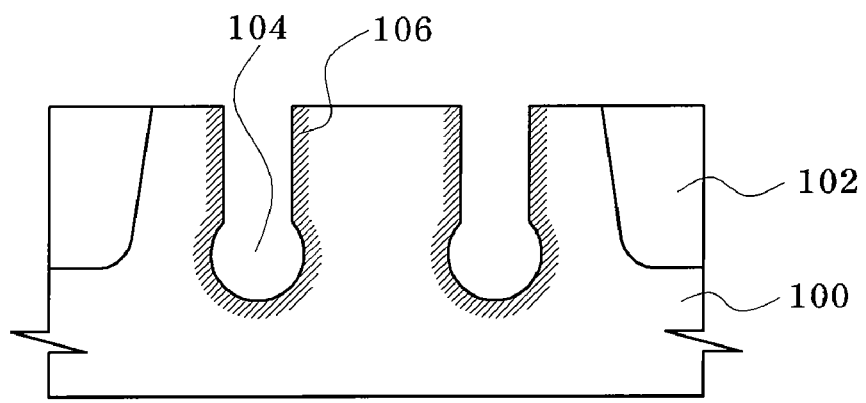
FIGS. 1 and 2 are sectional views for illustrating a conventional method for fabricating a semiconductor device having recess channels.
Figure 2:
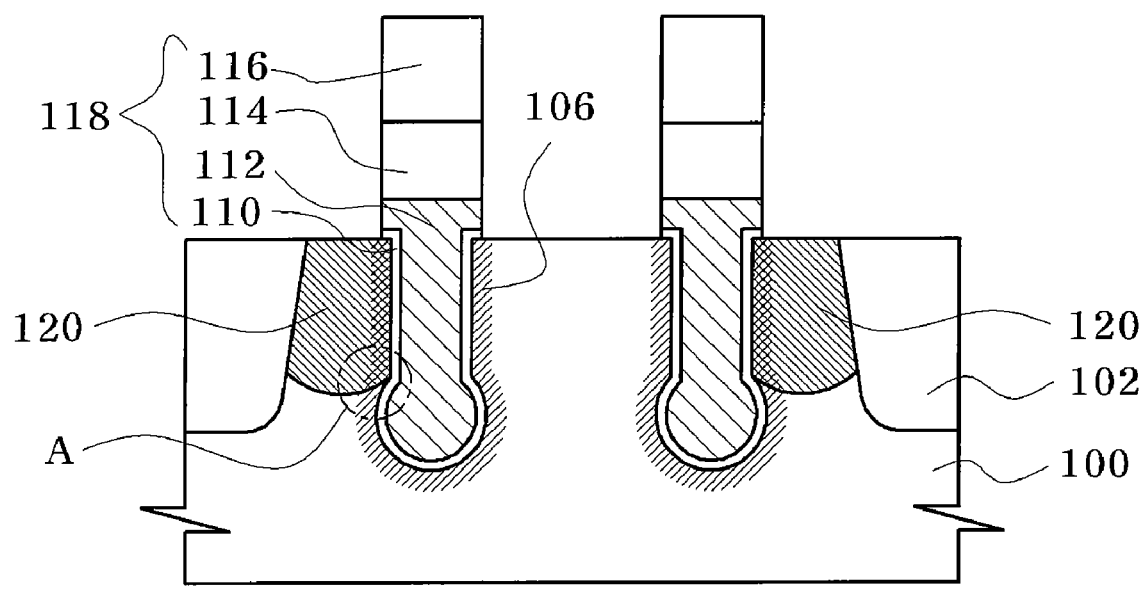

Embodiments of the present invention will be described in detail with reference to the annexed drawings. The present invention is not limited to the specific embodiments described herein, and various modifications, additions and substitutions are possible without departing from the scope of the present invention. In order to more easily illustrate various layers and regions, elements in the drawings may not have been drawn to scale. Elements having the same or like function throughout the descriptions are denoted by the same reference numerals, even through they are depicted in different drawings.

Figure 3:
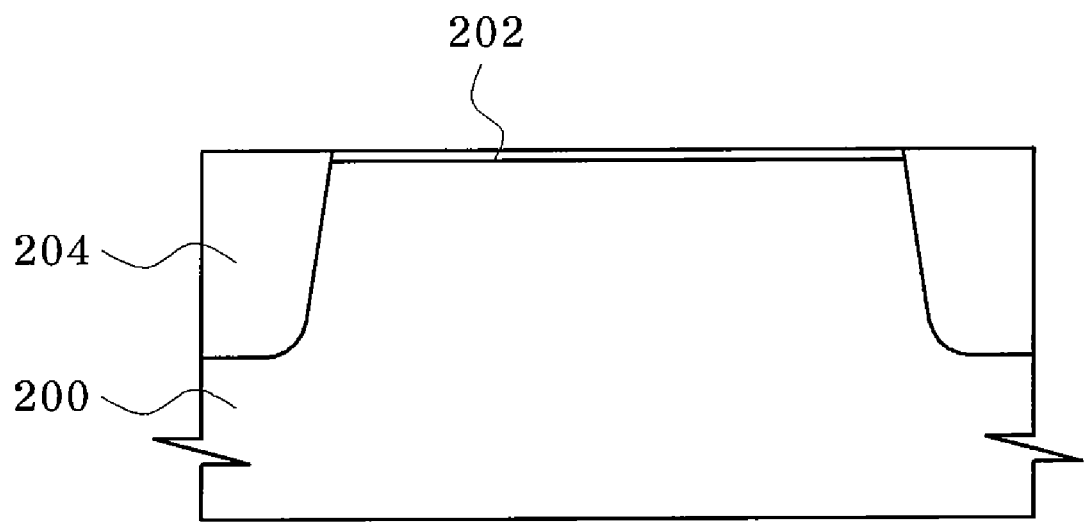
FIGS. 3 to 9 are sectional views for illustrating a method for forming trenches for recess channels in a semiconductor device in accordance with an embodiment of the present invention.

Referring to FIG. 3, a buffer film 202 for exposing device isolation regions of a semiconductor substrate 200 and a pad nitride film (not shown) are formed on the semiconductor substrate 200. An etching process of the exposed regions of the semiconductor substrate 200 is performed, thus forming trenches (not shown) having a designated depth in the semiconductor substrate 200. Thereafter, an insulating film is formed on the whole surface of the semiconductor substrate 200 so that the trenches are filled with the insulating material, then planarization is performed on the semiconductor substrate 200. The pad nitride film pattern is removed from the semiconductor substrate 200, thus forming an isolation structure 204 with the trench for defining the isolation regions of the semiconductor substrate 200. The isolation structure 204 is also referred to as a shallow trench isolation (STI) in other application. The buffer film 202 may include an oxide film.

Figure 4:
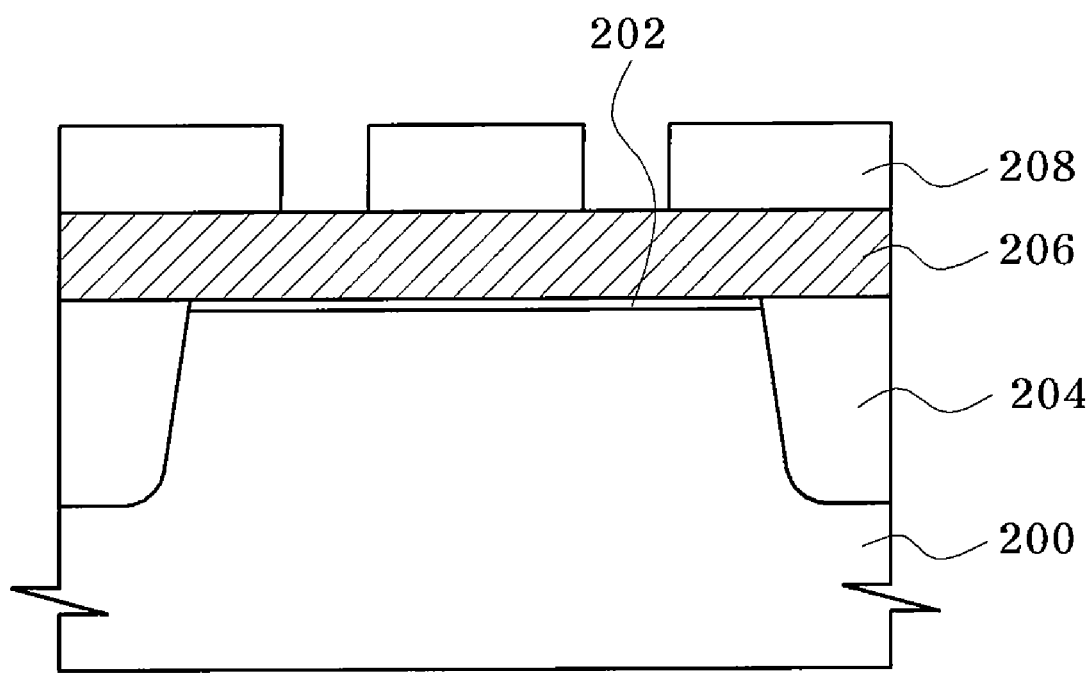

Referring to FIG. 4, a hard mask film 206 is formed on the semiconductor substrate 200. A photoresist film is deposited on the hard mask film 206 and then patterned, thus forming a photoresist film pattern 208 exposing designated regions of the hard mask film 206. Here, the hard mask film 206 is a polysilicon film having a thickness of 800~1,200 Å.

Figure 5:
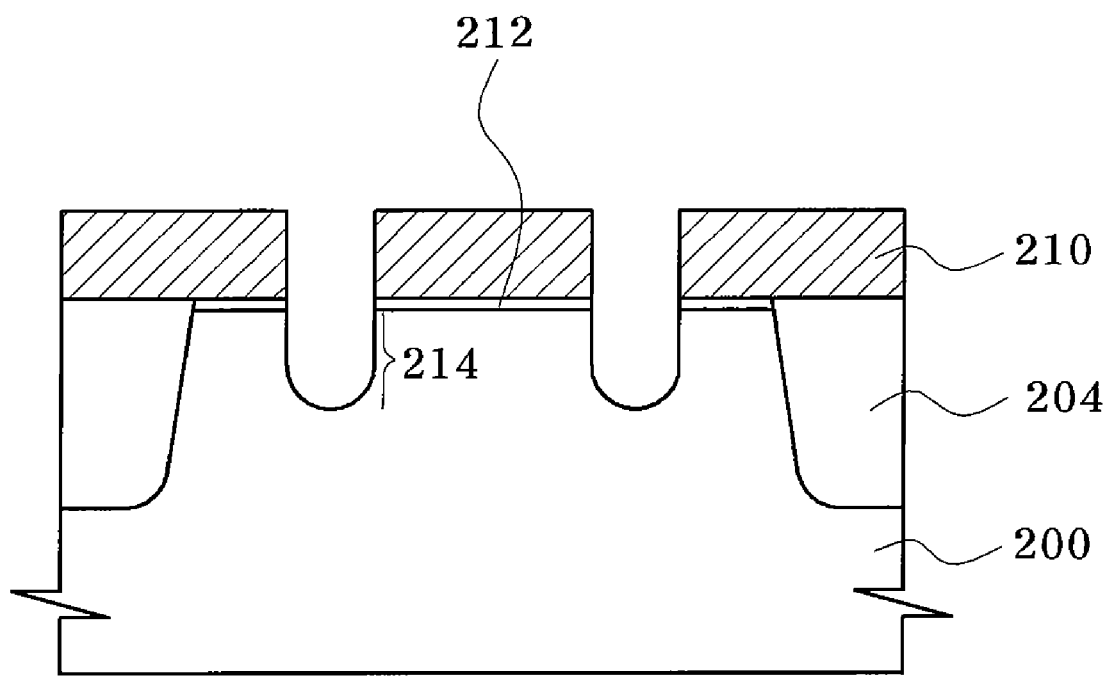

Referring to FIG. 5, the hard mask film 206 and the buffer film 202 are etched using the photoresist film pattern 208 as a mask, thus forming a hard mask film pattern 210 and a buffer film pattern 212 exposing first regions of the semiconductor substrate 200. Here, the first regions (not shown in the drawings) refer to regions in which bulb-type trenches for recess channels will be formed. A first etching process using the hard mask film pattern 210 as a mask is performed, thus forming first trenches 214 in the semiconductor substrate 200. The buffer film pattern 212 provided below the hard mask film pattern 210 may be deemed part of the mask. The hard mask film pattern 210 is removed from the semiconductor substrate 200 after the first etching process. Here, the first trenches 214 correspond to the neck portion of bulb-type trenches for recess channels and have a depth of 400~1,000 Å.

Figure 6:
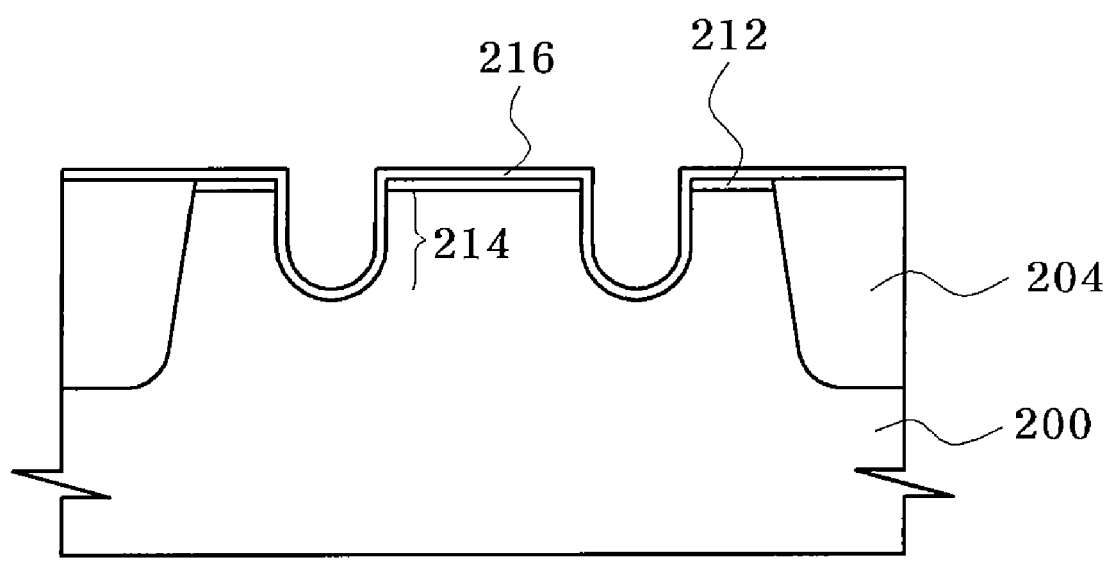

Referring to FIG. 6, a barrier film 216 is formed on the whole surface of the semiconductor substrate 200 including the first trenches 214. The barrier film 216 serves to prevent the semiconductor substrate 200 from being excessively etched during a subsequent second etching process for forming the bulb-type trenches for recess channels. The barrier film 216 includes a high temperature oxide (HTO) film and has a thickness of 30~100 Å in the present embodiment.

Figure 7:
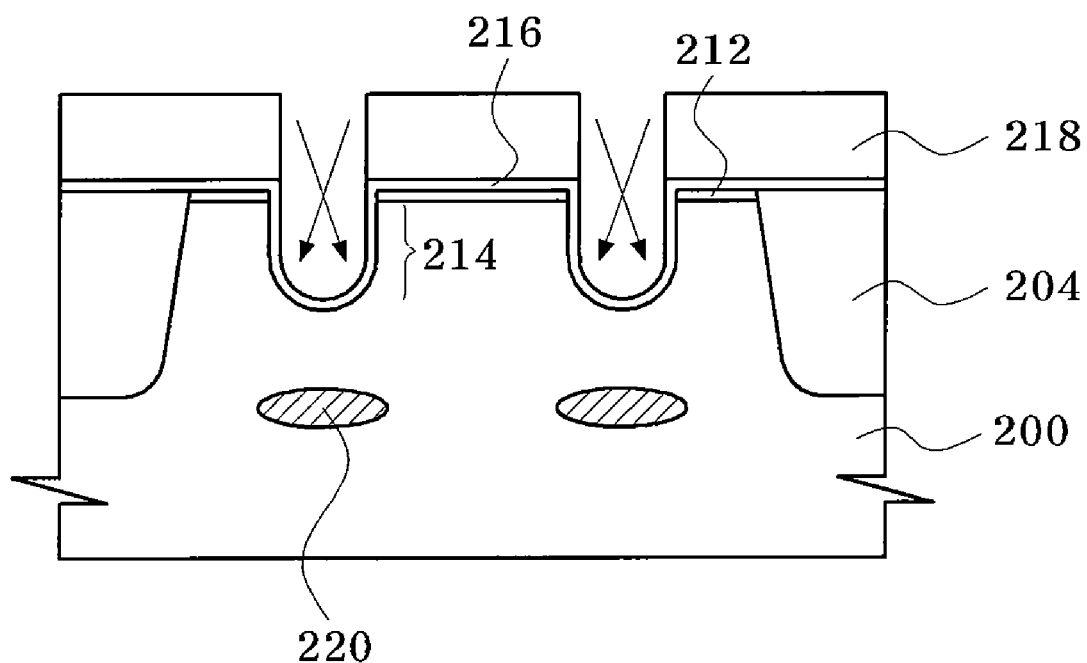

Referring to FIG. 7, a photoresist film is deposited on the barrier film 216 and patterned, thus forming an ion implantation mask film 218 of photoresist material exposing the first trenches 214. The ion implantation mask film 218 may be of different material in other implementations.

A local channel ion implantation (LCI) process is performed to implant impurities into the semiconductor substrate 200 below the first trenches 214 using the ion implantation mask film 218 and the barrier film 216 as a mask, thus forming an ion implantation region 220. In the LCI process, impurities are implanted into the semiconductor substrate 200 at a tilt angle of 5°~7° and are rotated at angles of 0° and 180°, so that the impurities are implanted into the semiconductor substrate 200 below the first trenches 214. Preferably, the ion implantation region 220 is formed at positions having a depth of 400~1,000 Å from the bottom of the first trenches 214. The ion implantation region 220 is formed at positions having a depth of 400~1,000 Å from the bottom of the first trenches 214, so that the widths and depths of the channel regions to be formed subsequently would not coincide with each other.

Figure 8:
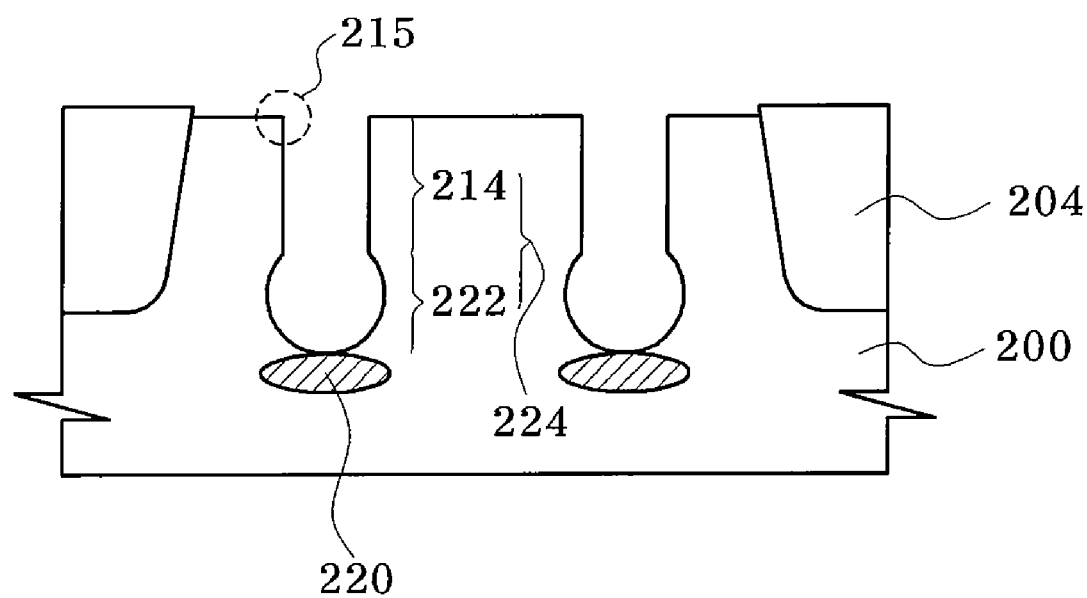

Referring to FIG. 8, the second etching process is performed using the ion implantation mask film 218 and the barrier film 216 as a mask, thus forming bulb-shaped second trenches 222 under the lower portions of the first trenches 214. Thereby forming bulb-type trenches 224 for recess channels, each including the first trench 214 and the second trench 222. The first and second trenches 214 and 216 may be referring to as the "neck" and "head" of the bulb-type trench.

Thereafter, a washing process is performed removing the ion implantation mask film 218 and the barrier film 216 remaining on the bulb-type trenches 224 from the semiconductor substrate 200. Then, a screen oxide film (not shown) having a thickness of 40~60 Å is formed on the semiconductor substrate 200. Conventional well ion implantation and channel ion implantation are performed using the screen oxide film as an ion implantation mask, then the screen oxide film is removed from the semiconductor substrate 200.

Here, the second trenches 222 have a depth of 400~1,000 Å from the bottom of the first trenches 214. Preferably, the second etching process employs an isotropic etching method, in which all directions are etched at the same speed to form a curved surface after etching. While the isotropic etching is performed, the barrier film 216 prevents excessive etching of the side surfaces of the bulb-type trenches 224.

In the conventional method, the second etching process is performed using only the barrier film 216 as an etching mask, thus generating damage to the silicon (Si) at the upper edges 215 of the bulb-type trenches 224 due to etching selectivity. In this embodiment of the present invention, the second etching process is performed using the barrier film 216 and the ion implantation mask film 218 of photoresist material as an etching mask, thus preventing damage to the silicon (Si) at the upper edges (or upper corners) 215 of the bulb trenches 224.

In this embodiment of the present invention, after the first trenches 214 are formed, the ion implantation region 220 is formed below the lower ends of the first trenches 214 by a channel ion implantation process (i.e., LCI process). Thereafter, the second trenches 222 are formed to define the bulb-type trenches 224 for recess channels, which includes both the first trench 214 and second trench 222. Consequently, the ion implantation region 220 is located at the lower ends of or below the bulb-type trenches 224. The ion implantation region, accordingly, is formed mostly at regions where the channels would be formed, thus decreasing the likelihood of overlap between the ion implantation region 220 and source/drain regions to be formed later, which helps in decreasing the electric field intensity at the overlap regions and improves refresh characteristics.

Figure 9:
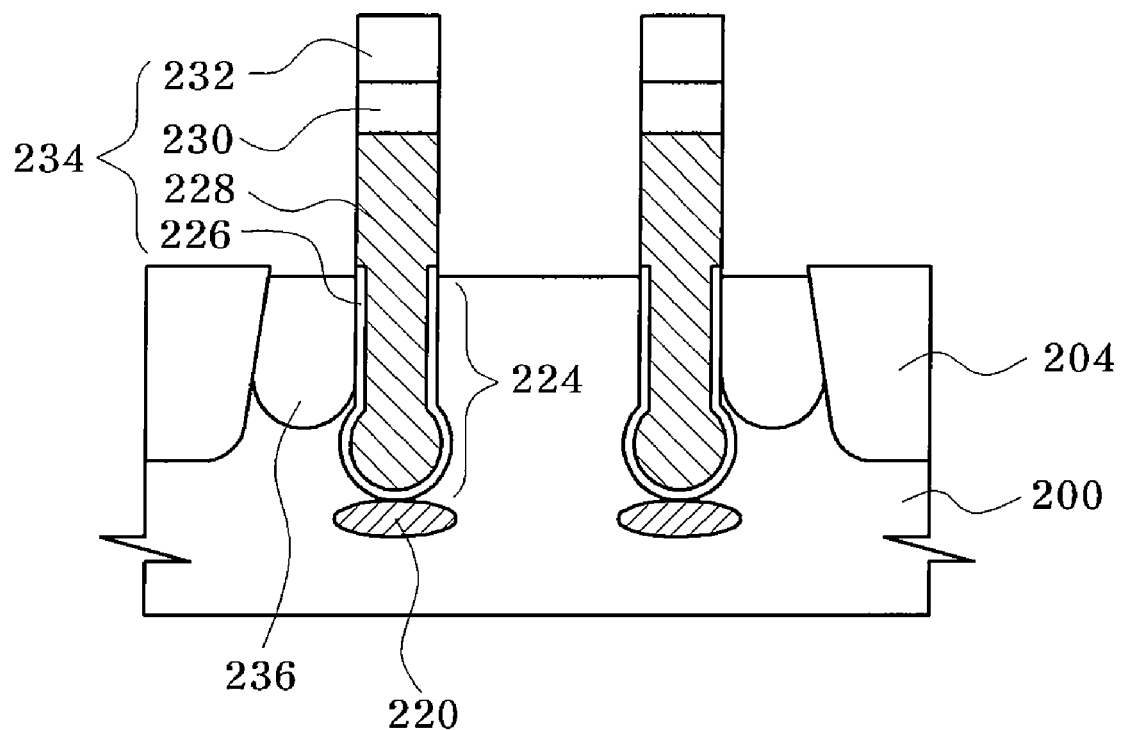

Referring to FIG. 9, gate stacks 234 are formed on the bulb-type trenches 224, and source/drain regions 236 are formed in the semiconductor substrate 200 by implanting impurities into the semiconductor substrate 200. Here, each of the gate stacks 234 includes a gate insulating film pattern 226 having a thickness of 30~50 Å, a conductive film pattern 228 made of a doped polysilicon film having a thickness of 400~700 Å, a metal film pattern 230 made of a tungsten silicide film having a thickness of 1,000~1,500 Å, and a hard mask film pattern 232 having a thickness of 2,000~2,500 Å.

In accordance with this embodiment of the present invention, the first trenches 214 are formed such that the ion implantation region 220 is located at the lower ends of or below the bulb-type trenches 224 and the LCI process is performed using the ion implantation mask film 218 made of a photoresist film and the barrier film 216 as a mask film. The overlap regions between the source/drain regions 236 and the ion implantation region 220 are reduced in the present embodiment, thereby preventing the increase of the electric field at the overlap regions and improving the refresh characteristics. Furthermore, the damage to the upper corners of the bulb-trench is reduced by using both the ion implantation mask film 218 (used in the ion implantation process) and the barrier film 216 as an etching mask.

Figure 10:
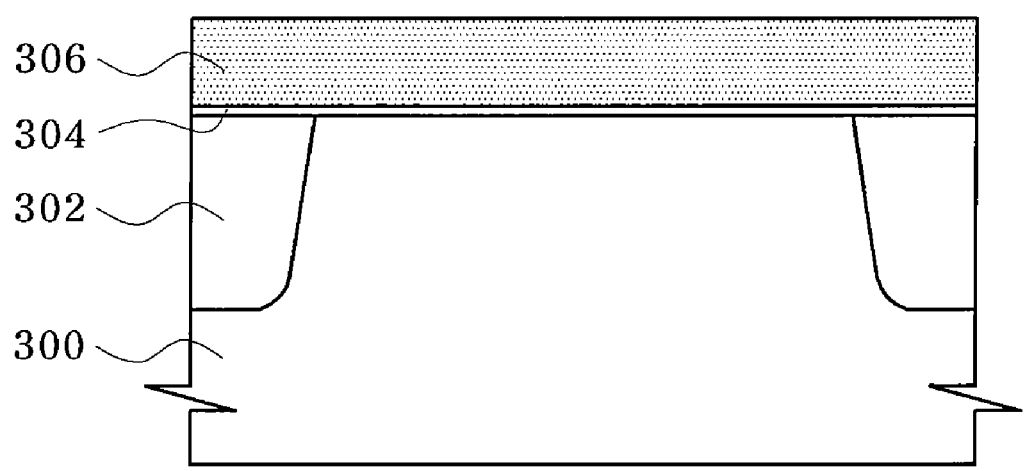
FIGS. 10 to 16 are sectional views for illustrating a method for forming trenches for recess channels in a semiconductor device in accordance with another embodiment of the present invention.

FIG. 10 illustrates a buffer film 304 and a hard mask film 306 formed on a semiconductor substrate 300 according to another embodiment of the present invention. The active region of the substrate 300 is defined by isolation structures 302. Here, the formation of the isolation structure 302 is similar to the formation of the isolation structure 204 of the earlier embodiment, thus a detailed description thereof will be omitted. The buffer film 304 is made of an oxide film by a conventional thermal process, and the hard mask film 306 is made of an amorphous carbon film and has a thickness of 2,000~3,000 Å. Since the amorphous carbon film has a higher etching selectivity than silicon (Si), the hard mask film 306 is scarcely removed during a subsequent etching process for forming first trenches. Thus the hard mask film 306 is used as an ion implantation mask film during a subsequent ion implantation process, such as a LCI process.

Figure 11:
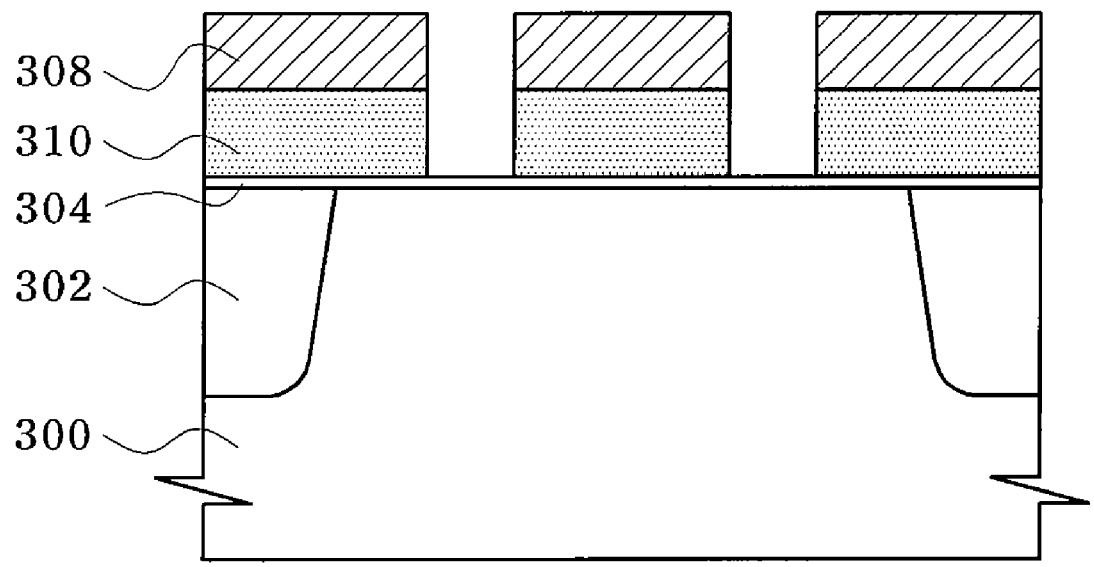

Referring to FIG. 11, a photoresist film is deposited on the hard mask film 306 and then patterned, thus forming a photoresist film pattern 308 exposing designated regions of the hard mask film 306. Then, a hard mask film pattern 310 is formed, using the photoresist film pattern 308, exposing the buffer film 304. Next, the photoresist film pattern 308 is removed from the semiconductor substrate 300.

Figure 12:
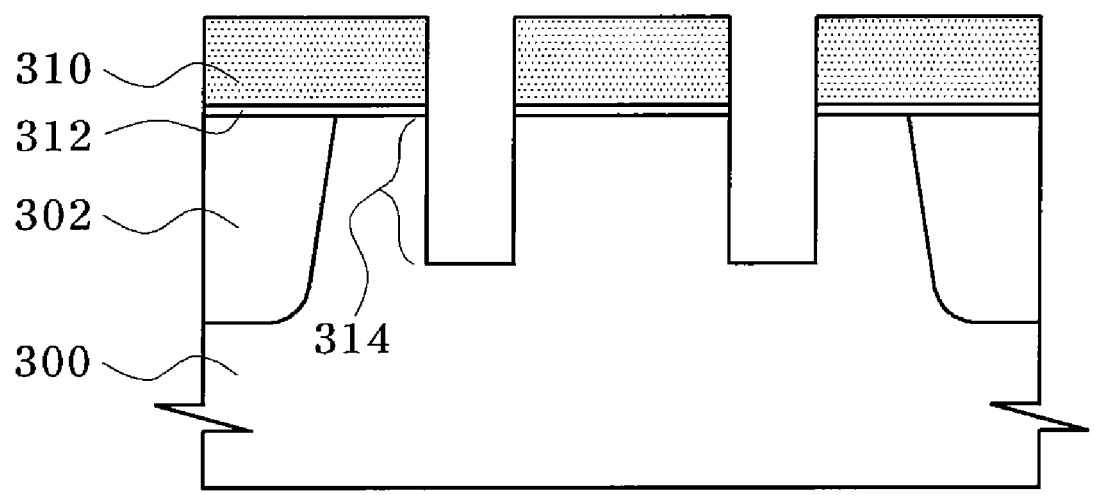

Referring to FIG. 12, a buffer film pattern 312 are formed, using the hard mask film pattern 310 as a mask, exposing first regions (not shown) of the semiconductor substrate 300. Here, the first regions refer to regions in which bulb-type trenches for recess channels will be formed. A first etching process using the hard mask film pattern 310 and the buffer film pattern 312 as a mask is performed, thus forming first trenches 314 in the semiconductor substrate 300. Here, the first trenches 314 correspond to the neck portion of bulb-type trenches for recess channels, and are formed to a depth of 400~1,000 Å by dry etching. In the case that the hard mask film pattern 310 made of an amorphous carbon film is used as the etching mask, the hard mask film pattern 310 is scarcely removed during the first etching process, thus is used as an ion implantation mask film during a subsequent ion implantation process, such as a LCI process.

Figure 13:
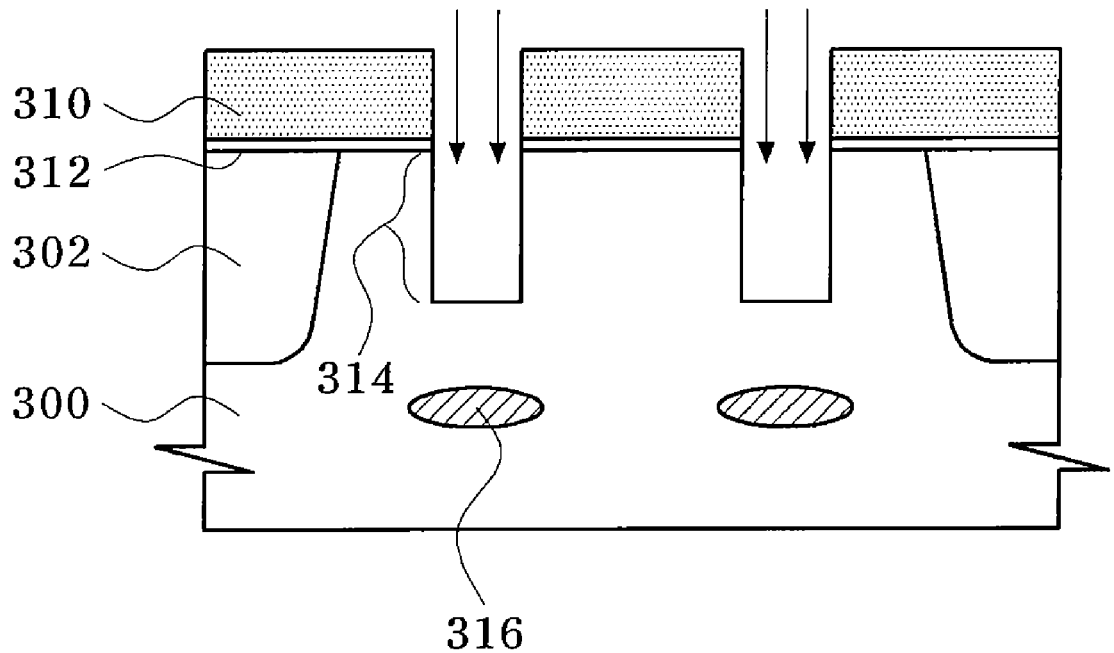

Referring to FIG. 13, the LCI process for implanting impurities into the semiconductor substrate 300 is performed below the first trench 314 using the hard mask film pattern 310 and the buffer film pattern 312 as an ion implantation mask, thus forming an ion implantation region 316. In the LCI process, impurities are implanted into the semiconductor substrate 300 at an energy of 20~30 keV and at a dose of 2.0~5.0E13 ions/cm$^2$. Preferably, the LCI process is performed so that the ion implantation region 316 is located at depths deeper than those of the second trenches, which will be formed later. Then, the hard mask film pattern 310 is removed from the semiconductor substrate 300.

Figure 14:
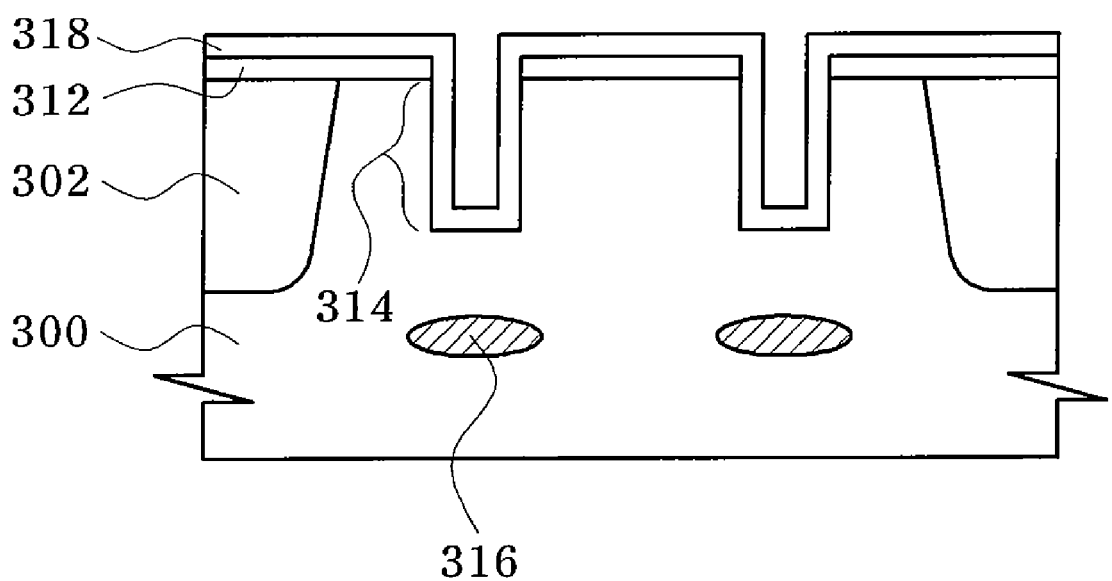

Referring to FIG. 14, a barrier film 318 having a thickness of 30~100 Å is formed on the whole surface of the semiconductor substrate 300 including the buffer film pattern 312. The barrier film 318 is made of an oxide film, and serves to prevent side surfaces of the bulb-shaped second trenches from being excessively etched during a subsequent second etching process, thus preventing the semiconductor substrate 300 from being damaged.

Figure 15:
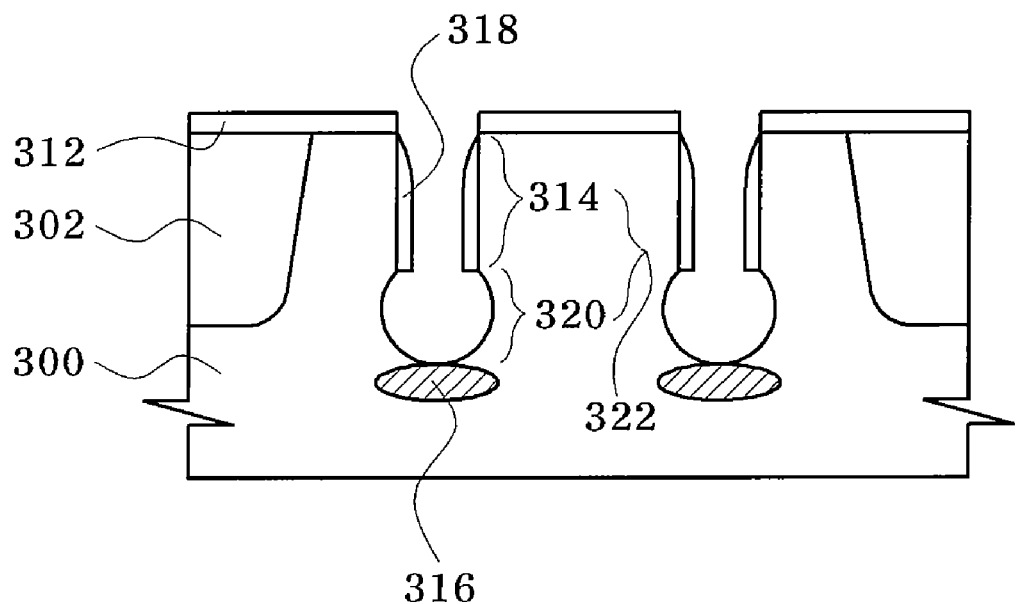

Referring to FIG. 15, the second etching process is performed using the buffer film pattern 312 and the barrier film 318 as a mask, thus forming the bulb-shaped second trenches 320 at the lower end of the first trenches 314. Thereby, bulb-type trenches 322 for recess channels (made up of the first trench 314 and second trench 320) are formed. Preferably, the second etching process employs an isotropic etching method, in which all directions are etched at the same speed to form a curved surface after etching. The second trenches 320 have a depth of 400~1,000 Å from the bottom of the first trenches 314. While the isotropic etching is performed, the barrier film 318 prevents excessive etching of the side surfaces of the bulb-shaped second trenches 320. Thereafter, a washing process is performed, removing the barrier film 318 remaining on the bulb-type trenches 322 for recess channels from the semiconductor substrate 300.

In this embodiment of the present invention, after the first trenches 314 are formed, the ion implantation region 316 is formed below the first trenches 314 by a channel ion implantation process (i.e., LCI process). Thereafter, the second trenches 320 are formed. Thereby, the bulb-type trenches 322 for recess channels, which includes the first trench 314 and second trench 320, are formed. Consequently, the ion implantation region 316 is located at the lower ends of the bulb-type trenches 322 for recess channels. Thereby, ion implantation is selectively performed only at regions for forming channels, thus decreasing overlapping regions between the ion implantation region 316 and source/drain regions (formed later), decreasing the intensity of electric fields at the overlapping regions and improving refresh properties.

Figure 16:
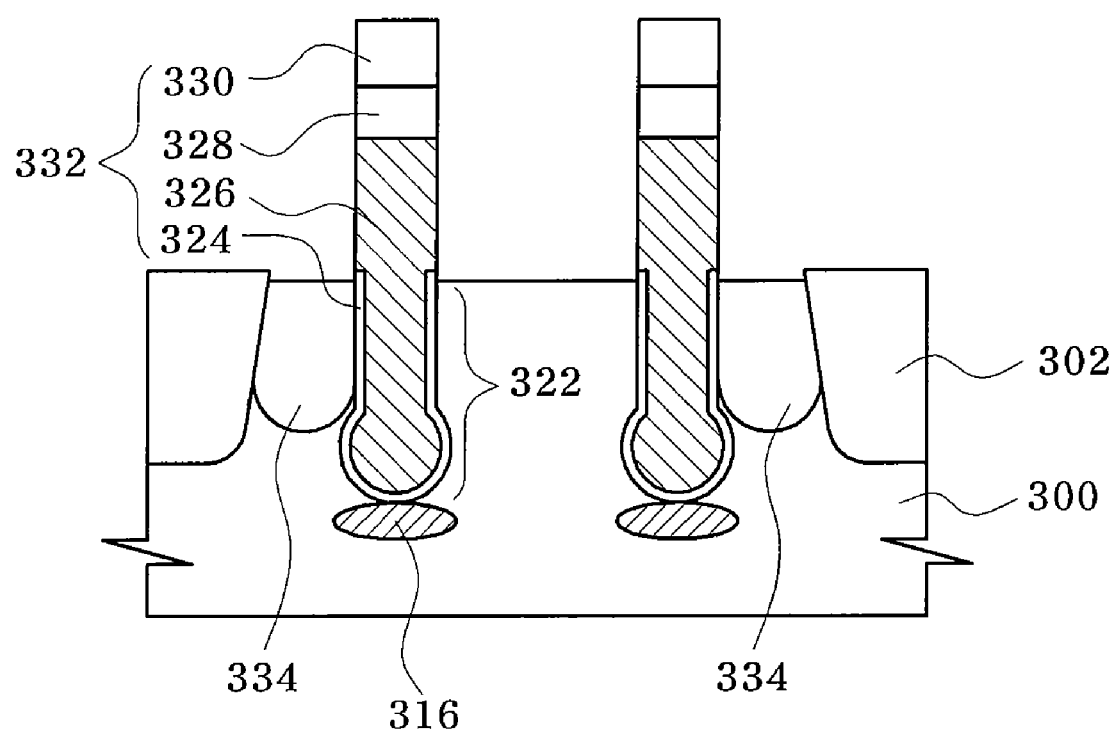

Referring to FIG. 16, gate stacks 332 are formed on the bulb-type trenches 322 for recess channels, and source/drain regions 334 are formed in the semiconductor substrate 300 by implanting impurities into the semiconductor substrate 300. Here, each of the gate stacks 332 includes a gate insulating film pattern 324, a conductive film pattern 326, a metal film pattern 328, and a hard mask film pattern 330.

In accordance with this embodiment of the present invention, the LCI process is performed such that the ion implantation region 316 is formed only at the lower ends of the bulb-type trenches 322, thus minimizing overlapping regions between the ion implantation region 316 and the source/drain regions 334, therefore decreasing the intensity of electric fields at the overlapping regions and improving refresh properties.

Further, in the case that an amorphous carbon film is used as an etching mask for forming the trenches, the amorphous carbon film is scarcely removed during the etching process, thus is used as an ion implantation mask film during the LCI process.

Moreover, the hard mask film 306 having a double structure including the barrier film 318 and the photoresist pattern 308 is used as an ion implantation mask film, preventing damage to the semiconductor substrate 300 during the etching process for forming bulb-type trenches for recess channels.

As apparent from the above description, the present invention provides a method for forming trenches for recess channels in a semiconductor device, in which an LCI process for forming channels is performed only in portions of a semiconductor substrate under the lower ends of trenches for the channels, thus improving refresh properties.

Further, a hard mask film having a double structure of a barrier film and a photoresist film pattern is used as an ion implantation mask film preventing damage to the semiconductor substrate during an etching process for forming the bulb-type trenches for recess channels.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a semiconductor device having recess channels, the method comprising:
   forming first trenches by performing a first etching process using a hard mask film pattern as a mask, and removing the hard mask pattern;
   forming a barrier film over an entire surface of each of the first trenches and the semiconductor substrate;
   forming an ion implantation mask film over the barrier film, wherein the ion implantation mask exposes the first trenches;
   forming an ion implantation mask over the barrier film and over an entire surface of each of the first trenches and the semiconductor substrate, wherein the ion implantation mask exposes the first trenches;
   forming an ion implantation region in the semiconductor substrate below the first trenches using the ion implantation mask film and the barrier film, wherein the ion implantation region is formed by implanting impurities into the semiconductor substrate at a tilt angle in a range of 5°-7°;
   forming second trenches below the first trenches by performing a second etching process using the ion implantation mask film and the barrier film as a mask, so that bulb-type trenches for recess channels are formed, each bulb-type trench including the first trench and the second trench; and
   removing the ion implantation mask film and the barrier film.

2. The method as set forth in claim 1, further comprising forming a buffer film pattern prior to forming of the hard mask film pattern.

3. The method as set forth in claim 1, wherein the hard mask film pattern comprises a polysilicon film.

4. The method as set forth in claim 1, wherein the hard mask film pattern has a thickness of 800~1,200 Å.

5. The method as set forth in claim 1, wherein the ion implantation mask film comprises a photoresist film.

6. The method as set forth in claim 1, wherein the first trenches have a depth of 400~1,000 Å.

7. The method as set forth in claim 1, wherein the barrier film comprises a High Thermal Oxide film.

8. The method as set forth in claim 1, wherein the barrier film has a thickness of 30~100 Å.

9. The method as set forth in claim 1, wherein the ion implantation region is formed by implanting impurities into the semiconductor substrate in the rotating direction of angles of 0° and 180°.

10. The method as set forth in claim 1, wherein the ion implantation region is formed at positions having a depth of 400~1,000 Å from lower ends of the first trenches.

11. The method as set forth in claim 1, wherein the second trenches are formed to have a depth of 400~1,000 Å from lower ends of the first trenches.

12. The method as set forth in claim 1, wherein the second etching process employs an isotropic etching method.

13. The method as set forth in claim 2, wherein the buffer film pattern comprises an oxide film.

* * * * *